United States Patent
Drory et al.

(10) Patent No.: US 8,413,033 B2
(45) Date of Patent: Apr. 2, 2013

(54) DEVICE AND METHOD FOR CALCULATING BACKWARD STATE METRICS OF A TRELLIS

(75) Inventors: Guy Drory, Givataaim (IL); Ron Bercovich, Kfar-Saba (IL); Aviel Livay, Holon (IL); Ilia Moskovich, Kiriat-Gat (IL); Yuval Neeman, Mazkeret Batia (IL)

(73) Assignee: Freescale Semiconductor, Inc., Austin, TX (US)

( * ) Notice: Subject to any disclaimer, the term of this patent is extended or adjusted under 35 U.S.C. 154(b) by 915 days.

(21) Appl. No.: 12/509,276

(22) Filed: Jul. 24, 2009

(65) Prior Publication Data

US 2011/0019781 A1    Jan. 27, 2011

(51) Int. Cl.
*H03M 13/00*    (2006.01)
(52) U.S. Cl. ...................................................... 714/796
(58) Field of Classification Search .................. 714/752, 714/753, 774, 786, 790–796
See application file for complete search history.

(56) References Cited

U.S. PATENT DOCUMENTS

| | | | |
|---|---|---|---|
| 6,014,411 A * | 1/2000 | Wang | 375/259 |
| 7,107,509 B2 | 9/2006 | Bickerstaff et al. | |
| 7,159,169 B2 | 1/2007 | Honary et al. | |
| 7,200,798 B2 * | 4/2007 | Bickerstaff | 714/794 |
| 8,205,145 B2 * | 6/2012 | Lee et al. | 714/796 |
| 2002/0119803 A1 | 8/2002 | Bitterlich et al. | |
| 2002/0174401 A1 * | 11/2002 | Wang et al. | 714/786 |
| 2003/0154357 A1 | 8/2003 | Master et al. | |
| 2005/0010854 A1 * | 1/2005 | Bickerstaff | 714/794 |
| 2011/0150146 A1 * | 6/2011 | Zhu | 375/340 |

OTHER PUBLICATIONS

Studer, C. et al., "Design and Implementation of a Parallel Turbo-Decoder ASIC for 3GPP-LTE", IEEE Journal of Solid-State Circuits, Jan. 2011, 9 pages.

* cited by examiner

*Primary Examiner* — Nadeem Iqbal

(57) ABSTRACT

A method for calculating backward state metrics of a trellis, the method includes: performing a radix-K calculation of backward state matrices of multiple states of at least one time instance of a trellis; and performing a radix-J calculation of backward state matrices of multiple states of at least one other time instance of the trellis; wherein K differs from J.

20 Claims, 3 Drawing Sheets

DEVICE AND METHOD FOR CALCULATING BACKWARD STATE METRICS OF A TRELLIS

FIELD OF THE INVENTION

This disclosure relates generally to devices that have backward state metrics calculation capabilities and to a method for calculating backward state metrics of a trellis.

BACKGROUND OF THE INVENTION

Wireless communication systems are widely deployed to provide various types of communications such as voice and data. One such system is wide band code division multiple access (WCDMA), which has been adopted in various competing wireless communication standards, e.g. third generation partnership project 3GPP, 3GPP project 2 (3GPP2) and long term evolution 3GPP (LTE 3GPP).

To overcome data corruption that can occur during Radio Frequency transmission, the different wireless communication standards typically include some form of channel coding, where one common channel coding technique is turbo coding.

Turbo coding involves the use of a turbo encoder for encoding a code segment (i.e. a data packet) and a turbo decoder for the decoding of the encoded code segment. A turbo encoder typically includes a pair of convolutional encoders, one of which receives information bits (i.e. systematic bits) while the other convolutional encoder receives interleaved information bits. The information bits are shuffled (interleaved) in accordance with a specified interleaving scheme. The pair of convolutional encoders output two sequences of parity bits that are frequency modulated and transmitted to a receiver. One sequence of parity bits is interleaved and the other is not interleaved. The systematic bits are also frequency modulated and transmitted to the receiver at a receiving side in the communication system.

The receiver has a turbo decoder that receives so-called channel data. Channel data includes the two sequences of parity bits, the systematic bits and channel induced errors. The turbo decoder processes channel data and interleaved channel data in order to reconstruct the data packets that were provided to the turbo encoder. Briefly, turbo decoding includes calculating branch metrics (gammas), path metrics—including forward state metrics (alphas) and backward state metrics (betas), and extrinsic information in a recursive manner.

Channel data can be processed in blocks (or sub portions of such blocks that are also referred to as windows). Odd sized blocks (including tail bits) are defined in various standards such as 3GPP, LTE 3GPP and CDMA2K.

Channel data can be represented by a trellis. The trellis includes multiple states that are arranged in so-called time instances. A time instance includes states that are associated with the same point in time. Different states of the same time instance are associated with different possible values of a channel data bit (or bits) that was received at a certain point in time. The trellis shows possible transitions between states over time. The encoding process selects between possible transitions from states of one time instance to another. The selected transitions are used to reconstruct the transmitted channel data. Each state is characterized by a branch metric and transitions to the state (and from the state) are characterized by path metrics. A path metric represents a transition probability from one state of the trellis to another state of the trellis. A backward state metric represents a transition probability from a state to an older state (a state that belongs to an older time instance). A forward state metric indicates a transition probability from a state to a newer state.

Multiple transition probabilities can enter a state and multiple transition probabilities can leaves the state. In a radix-2 trellis two transition probabilities enter a state and two transition probabilities leave a state. In a radix-4 trellis four transition probabilities enter a state and four transition probabilities leave a state. Thus, in a radix-2 trellis two state metrics (forward and backward) enter a state and two state metrics (forward and backward) exit the state.

Calculations of Radix-4 trellis inherently handle two trellis calculation steps of reaix-2 trellis per cycle. Accordingly—calculations of radix-4 trellis are twice as fast as calculations of radix-2 trellis. On the other hand radix-4 calculations require an even sized block. If an odd-sized block is to be processed by radix-4 calculations then it is padded by adding a padding time instance at the end of the block.

SUMMARY OF THE PRESENT INVENTION

The present invention provides a method and a device as described in the accompanying claims. Specific embodiments of the invention are set forth in the dependent claims. These and other aspects of the invention will be apparent from and elucidated with reference to the embodiments described hereinafter.

BRIEF DESCRIPTION OF THE DRAWINGS

Further details, aspects, and embodiments of the invention will be described, by way of example only, with reference to the drawings.

DETAILED DESCRIPTION OF THE DRAWINGS

In the following specification, the invention will be described with reference to specific examples of embodiments of the invention. It will, however, be evident that various modifications and changes may be made therein without departing from the broader spirit and scope of the invention as set forth in the appended claims.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

It has been found that a single trellis can be processed by applying different radix calculations of backward state matrices on different portions of the trellis. Initializing these calculations by lower radix calculations of backward state matrices and then switching to higher radix calculations of backward state matrices can provide various benefits such as a better error rate.

Figure 1:
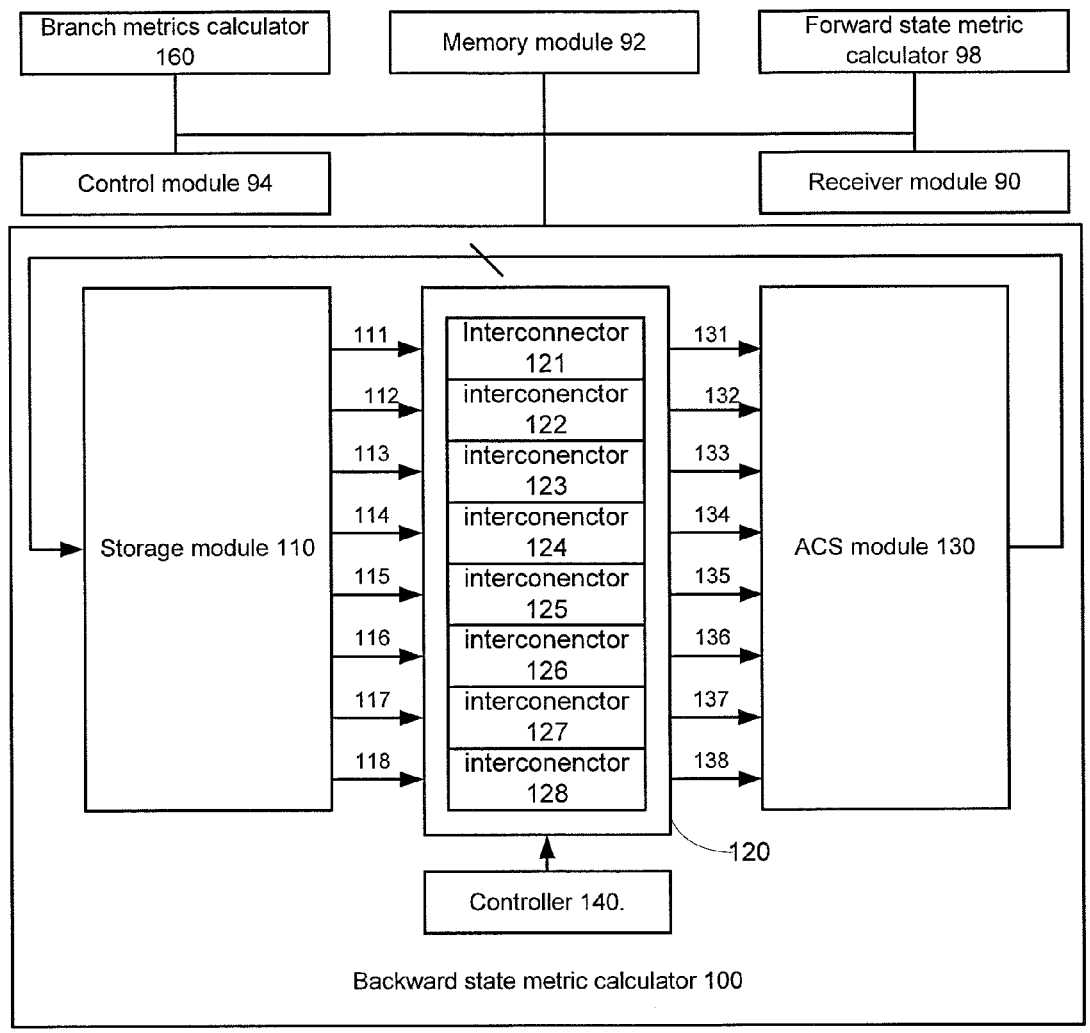
FIG. 1 schematically shows an example of an embodiment a device.

FIG. 1 schematically shows an example of an embodiment of device 10 that has backward state metric calculation capabilities.

Device 10 can, for example, be a turbo decoder, include a turbo decoder, can apply other decoding schemes, can be a mobile phone, a laptop computer, a media player, a digital data accessory, a mobile device, a radio, a base station, a static device, and the like.

Device 10 can include receiver module 90, memory module 92, control module 94, branch metric calculator 96, forward state metric calculator 98, backward state metric calculator 100 and reconstruction module 102.

Receiver module 90, memory module 92, control module 94, branch metric calculator 96, forward state metric calculator 98, backward state metric calculator 100 and reconstruction module 102 can be connected to each other in various manners. FIG. 1 illustrates a bus that is connected to control module 94 and each of these components. Reconstruction module 102 can reconstruct the code segment in response to branch metrics, path metrics, forward and backward metrics and channel data.

Control module 94 controls the operation of these various components. It cans end commands, timing signals, and instruction that determine when each components shall work and on which information each component shall work.

Receiver module 90 receives channel data and converts is to digital signals representative of the channel data. For convenience of explanation these digital signals are also referred to as channel data. Receiver modules are known in the art are require no additional explanation. A typical receiver can include a radio frequency front end, a de-modulator, a down converter, and an analog to digital converter.

Channel data, path metrics, forward and backward state metrics and encoded data are stored in memory module 92. Channel data can be provided form receiver module 90, path metrics can be provided from path metric calculator 160, forward and backward state metrics can be provided from backward state metric calculator 100 and forward state metric calculator 98.

Forward state metric calculator 100 that is configured to perform a radix-K calculation of forward state matrices of multiple states of at least one time instance of a trellis and perform a radix-J calculation of forward state matrices of multiple states of at least one other time instance of the trellis. K differs from J.

Backward state metric calculator 100 is configured to perform a radix-K calculation of backward state matrices of multiple states of at least one time instance of a trellis and perform a radix-J calculation of backward state matrices of multiple states of at least one other time instance of the trellis. K differs from J.

Although in the example a single backward state metric calculator is shown, device 10 can include more than one backward state metric calculator. For example it can include a first backward state metric calculator that is configured to perform a radix-K calculation of backward state matrices of multiple states of at least one time instance of a trellis and a second backward state metric calculator that is configured to perform a radix-J calculation of backward state matrices of multiple states of at least one other time instance of the trellis.

Backward state metric calculator 100 includes storage module 110, interconnecting circuit 120, add compare select (ACS) module 130, and controller 140. Interconnecting circuit 120 is connected between storage module 110 and add compare select (ACS) module 130. It also receives control signals from controller 140. The output of ACS module 130 is connected to an input of storage module 110. ACS module 130 is also connected to branch metric calculator 160 (for receiving path metrics) and to memory module 92 (for outputting backward state metrics).

Eights connections 111-118 are provided between outputs of storage module 110 and inputs of interconnecting circuit 120. Eights connections 131-138 are provided between inputs of ACS module 130 and outputs of interconnecting circuit 120. It is noted that the number of connections can differ from eight. The number of connections can represent the number of states in a single time instance. Interconnecting circuit 120 is illustrated as including interconnectors 121-128. Each interconnector is associated with a single output of interconnecting circuit 120 and can connect to this single output any of input connections 121-128.

In operation, backward state metric calculator 100 performs multiple iterations of backward state metric calculations. Each iteration includes providing results (such as backward state metrics) that are related to a single time instance the trellis. These results are stored in storage module 110 and can be used during a next iteration. During the next iteration another time instance of the trellis is processed. When the multiple iterations start backward state metric calculator 100 receives initialization information such as initial backward state metrics, channel data and branch metrics. When the multiple iterations ends backward state metric calculator 100 can output backward state metrics it calculated. These backward state metrics can be stored in memory unit 92 and processed by reconstruction module 102.

Interconnecting circuit 120 can connect storage module 110 to ACS module 130. Interconnecting circuit 120 is configured such as to provide a connectivity between storage circuits of storage module 120 and ACS circuits of ACS module 130 that corresponds to the possible transitions from states of a previous time instance to a current time instance of the trellis. For example, in radix-4 an ACS circuit that represents a single stage of the trellis shall be connected to receive four backward branch metrics and four branch metrics associated with possible transitions to that single state.

Interconnecting circuit 120 can include, for example, multiplexers, de-multiplexers, interconnects, logic gates, switches and the like which can be configured to provide desired logic paths between ACS circuits and entries (or storage components) of storage module 110.

ACS module 130 includes multiple ACS circuits, each ACS circuit can include one or more ACS cells—each ACS cell is capable of performing an "add compare select" operation between multiple candidates. Each candidate represents a transition from a state of the trellis to a state represented by the ACS cell. Each candidate has a branch metric and a backward state metric. The "add compare select" operation includes adding a branch metric and a backward state metric of a first candidate to provide a first sum, adding a branch metric and a backward state metric of a second candidate to provide a second sum, comparing the first sum to the second sum to provide a comparison result and selecting between the candidates in response to the comparison result.

A radix-2 ACS cell can select between two candidates—two possible transitions that enter a single state of the trellis by: (a) adding a first branch metric to a first backward state branch metric to provide a first candidate, (b) adding a second branch metric to a second backward state branch metric to provide a second candidate, (c) comparing the first and second candidates and (d) selecting one of the first and second candidates in response to the comparison result.

Interconnecting circuit 120 can be configured to provide a path over which multiple results of a previous iteration (or initial values) are sent to one or more ACS circuits of ACS module 130.

Interconnecting circuit 120 can be configured to multiple different configurations, such as a radix-J configuration and a radix-K configuration. These configurations differ from each other by the data (backward state metrics) that are provided to different ACS circuits of ACS module 130—and more specifically by the storage circuits which provide candidates to each ACS circuit.

In a radix-J configuration each ACS module can receive J backward state metrics that represent J different possible transitions to enter a state. In radix-K configuration each ACS module can receive K backward state metrics that represent K different transitions to enter a state. If, for example, a radix-J ACS module is used to perform a radix-K calculation then it can receive J inputs from K different storage circuits. The same storage circuit can provide results to more than a single input of an ACS circuit.

ACS module 130 can include radix-4 ACS modules that can perform radix-2 as well as radix-4 calculations. Each ACS module can include a pair of input radix-2 ACS cells and output radix-2 ACS cell. The outputs of the pair of input radix-2 ACS cells are connected to respective outputs of the output radix-2 ACS cell.

Figure 2A:
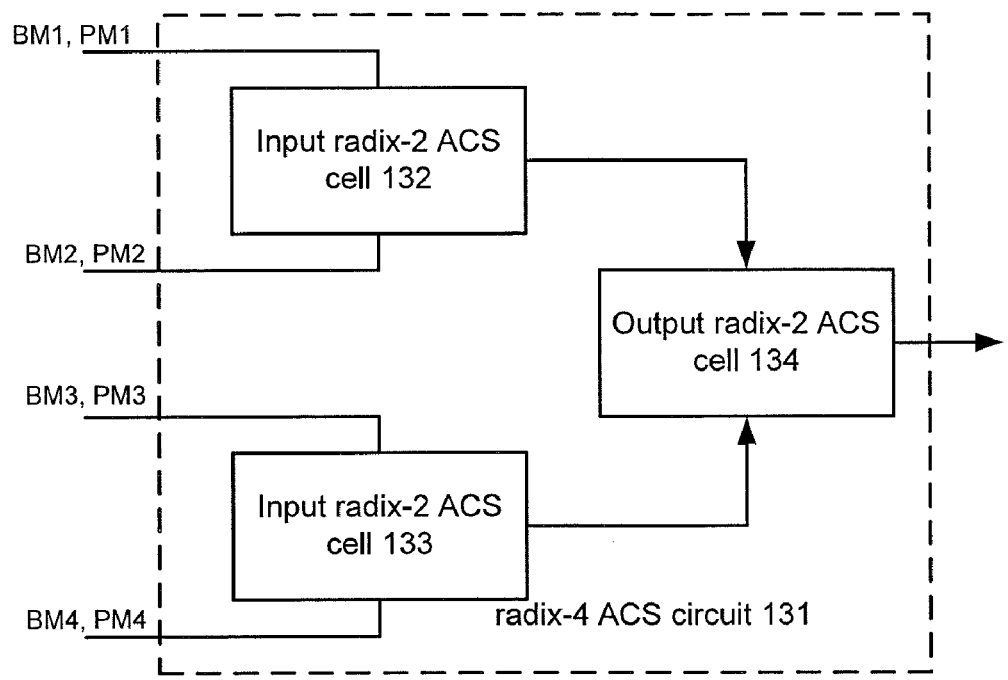
FIGS. 2A and 2B schematically illustrate an example of an embodiment of an ACS circuit.
Figure 2B:
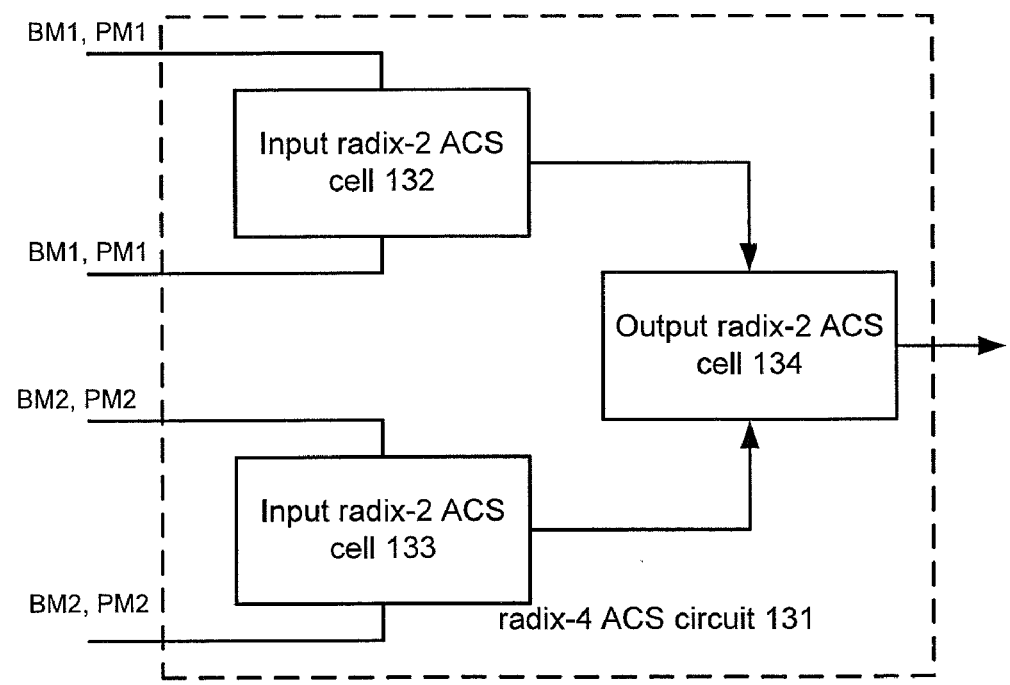

FIG. 2A and FIG. 2B schematically illustrate an example of an embodiment of an ACS circuit 131.

ACS circuit 131 includes two input radix-2 ACS cells 132 and 133 and output radix-2 ACS cell 134. ACS circuit 131 can be regarded as a radix-4 ACS circuit. The outputs of input radix-2 cells 132 and 133 are connected to respective inputs of output radix-2 ACS cell 134.

FIG. 2A illustrates the information provided to ACS circuit 131 when performing radix-4 calculations during which four different candidates are compared to each other and a selected candidate is found. ACS circuit 131 receives (via interconnecting circuit 120) four backward state metrics PM1-PM4 and receives (from branch metric calculator 160 or memory unit 92) four branch metrics BM1-BM4. ACS circuit 131 performs the calculation for a certain state of the trellis. PM1-PM4 and BM1-BM4 are associated with four transitions (from four states of the trellis) into the certain state of the trellis.

Input radix-2 ACS cell 132 receives PM1, BM1 (associated with a first candidate), PM2 and BM2 (associated with a second candidate), adds PM1 to BM1 to provide a first sum, adds PM2 to BM2 to provide a second sum, compares between the first and second sums and selects a candidate out of the first and second candidates.

Input radix-2 ACS cell 133 receives PM3, BM3 (associated with a third candidate), PM4 and BM4 (associated with a fourth candidate), adds PM3 to BM3 to provide a third sum, adds PM4 to BM4 to provide a fourth sum, compares between the third and fourth sums and selects a candidate out of the third and fourth candidates.

The candidates that were selected by each input radix-2 ACS cells 132 and 133 are fed to output radix-2 ACS cell 134 that compares these candidates to each other and selects a selected candidate out of the four candidates.

FIG. 2B illustrates the information provided to ACS circuit 131 when performing radix-2 calculations during which two different candidates are compared to each other and a selected candidate is found. ACS circuit 131 receives (via interconnecting circuit 120) two pairs of backward state metrics, each pair includes a first backward state metric (PM1) and a second backward state metric (PM2). ACS circuit 131 also receives (from branch metric calculator 160 or memory unit 92) two pairs of branch metrics, each pair includes a first branch metric (BM1) and a second branch metric (BM2).

ACS circuit 131 performs the calculation for a certain state of the trellis. PM1-PM2 and BM1-BM2 are associated with two different transitions (from two states of the trellis) into the certain state of the trellis.

Input radix-2 ACS cell 132 receives PM1, BM1 (associated with a first candidate), adds PM1 to BM1 to provide a first sum, adds PM1 to BM1 to provide a second sum, compares between the first and second sums and selects the first candidate.

Input radix-2 ACS cell 133 receives PM2, BM2 (associated with a second candidate), adds PM2 to BM2 to provide a third sum, adds PM2 to BM2 to provide a fourth sum, compares between the third and fourth sums and selects the second candidate.

The first and second candidates are fed to output radix-2 ACS cell 134 that compares these candidates to each other and selects a selected candidate out of the two candidates.

It is noted that FIG. 2B illustrates a provision of data that virtually bypasses the input 2-radix ACS cells 132 and 133.

Alternatively, when performing radix-2 calculations first inputs of the first and second input radix-2 ACS cells receive a first backward state metric from a certain storage circuit and second inputs of these input radix-2 ACS cells receives another backward state metric from another certain storage circuit. This causes each of these input radix-2 ACS cells to perform the add compare select operation.

Referring back to FIG. 1, controller 140 can determine when to perform radix-J calculation of backward state matrices and when to perform radix-K calculation of backward state matrices.

Controller 140 can select between these two option in response to one of the following: a detection of a beginning of a backward state matrices calculation sequence; a detection of an end tail of the trellis; a detection that the backward state calculation sequence is at a stage that triggers the selection, and the like.

Controller 140 can send instructions, command or other configuration information that selects between the radix-J configuration and the radix-K configuration of interconnecting circuit 120.

Controller 140 can select between a set of configuration information that determined paths between ACS circuits of ACS module 130 and between elements of storage module 110. (such as radix-J polynomial settings and radix-K polynomial settings) and send the selected configuration information via a multiplexer (not shown) to interconnecting circuit 120.

Device 10 can calculate branch metrics or receive branch matrices. FIG. 1 illustrates branch metric calculator 160 that is included in device 10. Branch metric calculator 160 can calculate the branch metrics in response to expected channel data values. It can, for example, ignore (or assign a lower weight) padding information associated with time instances that include padding information.

By applying different radix calculations of backward state matrices device 10 processes backward state metrics associated with different states of different time instances of the same trellis in different manners.

Device 10 can apply these calculations on an odd size block that was padded to provide an even sized padded block. The odd size block includes information of interest such as channel data or interleaved channel data.

Device 10 can perform the radix-K calculation of backward state matrices of multiple states of a single time instance of the trellis. This single time instance can be the last time instance of the block—which is the first time instance to be processed during the calculation of the backward state metrics. This single time instance can represent padding information. This single time instance can form a tail of the trellis.

As illustrated above, device 10 performs, at one point in time, a radix-K calculation of backward state matrices of multiple states of at least one time instance of a trellis and at a different point in time performs a radix-J calculation of backward state matrices of multiple states of at least one other time instance of the trellis; wherein K differs from J.

Figure 3:
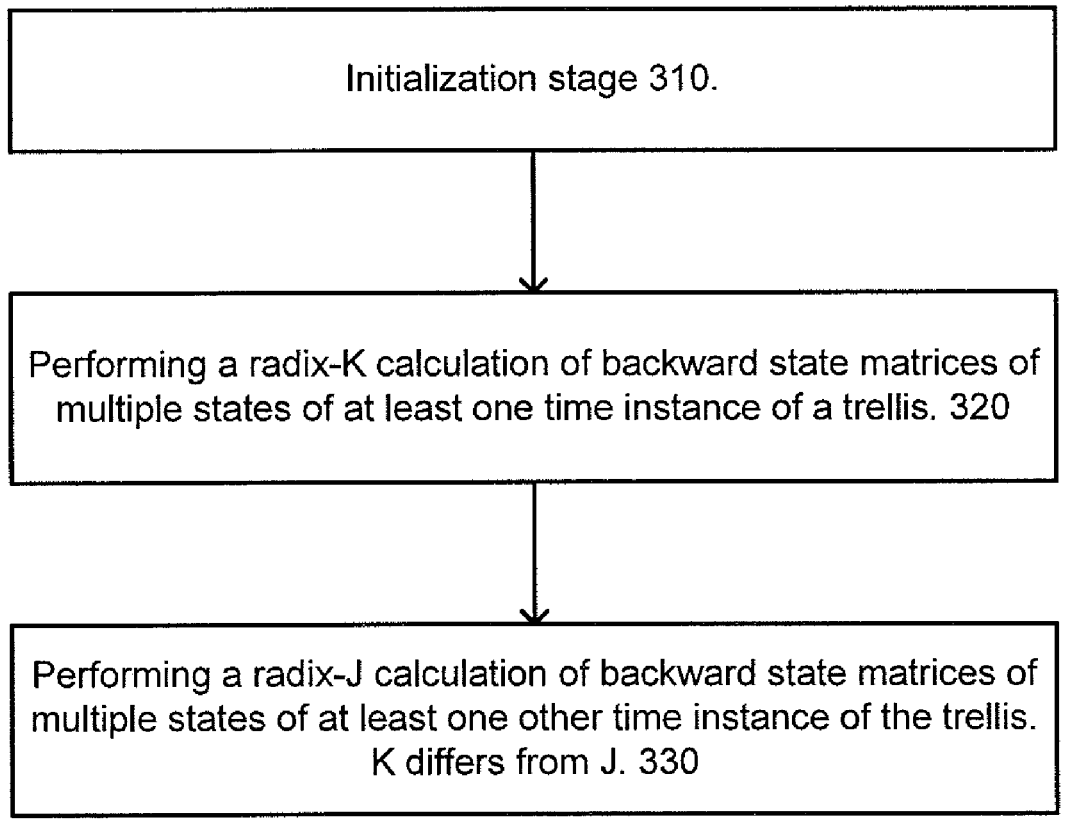
FIG. 3 schematically shows an example of an embodiment of a method for calculating backward state metrics.

FIG. 3 schematically shows an example of an embodiment of method 300 for calculating backward state metrics of a trellis.

Method 300 starts by initialization stage 310. Initialization stage 310 can include receiving channel data, receiving branch metrics, providing initial values to storage circuits, and the like.

Stage 310 is followed by stage 320 of performing a radix-K calculation of backward state matrices of multiple states of at least one time instance of a trellis.

Stage 320 is followed by stage 330 of performing a radix-J calculation of backward state matrices of multiple states of at least one other time instance of the trellis. K differs from J.

By executing stage 320 and 320 different time instances of the same trellis are processed in different manners.

J can be an integer multiple of K. For example, J can equal 2*K. J and K may be different powers of two, for example K can equal $2^M$ and J can equal $2^N$, wherein N differs from M.

Yet for another example, J can equals 4 and K can equal 2. In this case, stage 320 includes radix-2 calculation of backward state matrices and stage 330 includes radix-4 calculation of state matrices.

The size of a Radix-$2^N$ block is usually dividable by N. A block that is not dividable by N can be padded accordingly. Thus—odd blocks can be padded by adding a single time instance in the case of K=2 and J=4 but this single time instance padding can differ for other combinations of J and K.

These calculations can be applied on odd size blocks that were padded to provide an even size padded blocks. The odd size block included information of interest such as channel data or interleaved channel data.

Stage 320 can include performing the radix-K calculation of backward state matrices of multiple states of a single time instance of the trellis. This single time instance can be the last time instance of the block—which is the first time instance to be processed during the calculation of the backward state metrics. This single time instance can represents padding information. This single time instance can form a tail of the trellis.

Stage 320 and 330 can be executed by different backward state metric calculators or by the same backward state metric calculator.

The single backward state metric calculator can have two configurations—a radix-K configuration and a radix-J configuration. In this case stage 320 can include selecting the a radix-K configuration and performing the radix-K calculation of backward state matrices and stage 330 can include selecting the a radix-J configuration and performing the radix-J calculation of backward state matrices.

The single backward metric calculator can include an interconnecting circuit that connects between storage circuits and add compare select circuits. The interconnecting circuit can have two configurations—a radix-K configuration and a radix-J configuration. Accordingly, method 300 includes selecting between a radix-K configuration and a radix-J configuration of the interconnecting circuit that connects between storage circuits and add compare select circuits.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Thus, it is to be understood that the architectures depicted herein are merely exemplary, and that in fact many other architectures can be implemented which achieve the same functionality.

In addition, the devices may be physically distributed over a number of apparatuses, while functionally operating as a single device.

However, other modifications, variations, and alternatives are also possible. The specifications and drawings are, accordingly, to be regarded in an illustrative rather than in a restrictive sense.

The word 'comprising' does not exclude the presence of other elements or steps then those listed in a claim. Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

It will be apparent that various alterations and modifications to the above described examples are possible. For example, memory module 92 can include storage module 110.

We claim:

1. A method for calculating backward state metrics of a trellis, the method comprises: performing a radix-K calculation of backward state matrices of multiple states of at least one time instance of a trellis; and performing a radix-J calculation of backward state matrices of multiple states of at least one other time instance of the trellis; wherein K differs from J.

2. The method according to claim 1 wherein J is an integer multiple of K.

3. The method according to claim 1 wherein J equals 4 and K equals 2.

4. The method according to claim 1 comprising performing the radix-K calculation of backward state matrices of multiple states of a single time instance of the trellis and then performing the radix-J calculation of backward state matrices of multiple states of remaining time instances of the trellis.

5. The method according to claim 1 comprising performing the radix-K calculation of backward state matrices of multiple states of a first time instance of the trellis and then performing the radix-J calculation of backward state matrices of multiple states of remaining time instances of the trellis.

6. The method according to claim 1 comprising performing the radix-K calculation of backward state matrices of multiple states of a single time instance of the trellis that represents padding information and then performing the radix-J calculation of backward state matrices of multiple states of remaining time instances of the trellis that represent information of interest.

7. The method according to claim 1 comprising performing the radix-K calculation of backward state matrices of multiple states of a single time instance of the trellis that represents padding information and then performing the radix-J calculation of backward state matrices of multiple states of an odd number of other time instances of the trellis that represent information of interest.

8. The method according to claim 1 comprising selecting between a radix-K configuration and a radix-J configuration of an interconnecting circuit that connects between storage circuits and add compare select circuits.

9. The method according to claim 1 comprising selecting between a radix-K configuration and a radix-J configuration of an interconnecting circuit that connects between storage circuits and add compare select circuits; wherein K equals 2 and J equals 4.

10. The method according to claim 1 comprising selecting between a radix-K configuration and a radix-J configuration of an interconnecting circuit that connects between storage circuits and add compare select circuits; wherein the selection is responsive to a detection of a trellis tail.

11. A device having backward state metric calculation capabilities, the device comprises a backward state metric calculator configured to perform a radix-K calculation of backward state matrices of multiple states of at least one time instance of a trellis and perform a radix-J calculation of backward state matrices of multiple states of at least one other time instance of the trellis; wherein K differs from J.

12. The device according to claim 11 wherein J is a integer multiple of K.

13. The device according to claim 11 wherein J equals 4 and K equals 2.

14. The device according to claim 11 wherein the backward state metric calculator performs the radix-K calculation of backward state matrices of multiple states of a single time instance of the trellis and then performs the radix-J calculation of backward state matrices of multiple states of remaining time instances of the trellis.

15. The device according to claim 11 wherein the backward state metric calculator performs the radix-K calculation of backward state matrices of multiple states of a first time instance of the trellis and then performs the radix-J calculation of backward state matrices of multiple states of remaining time instances of the trellis.

16. The device according to claim 11 wherein the backward state metric calculator performs the radix-K calculation of backward state matrices of multiple states of a single time instance of the trellis that represents padding information and then performs the radix-J calculation of backward state matrices of multiple states of remaining time instances of the trellis that represent information of interest.

17. The device according to claim 11 wherein the backward state metric calculator performs the radix-K calculation of backward state matrices of multiple states of a single time instance of the trellis that represents padding information and then performs the radix-J calculation of backward state matrices of multiple states of an odd number of other time instances of the trellis that represent information of interest.

18. The device according to claim 11 wherein the backward state metric calculator selects between a radix-K configuration and a radix-J configuration of an interconnecting circuit that connects between storage circuits and add compare select circuits.

19. The device according to claim 11 wherein the backward state metric calculator selects between a radix-K configuration and a radix-J configuration of an interconnecting circuit that connects between storage circuits and add compare select circuits; wherein K equals 2 and J equals 4.

20. The device according to claim 11 wherein the backward state metric calculator comprises a radix-K backward state metric calculation module and radix-J backward state metric calculation module.

* * * * *